US010886343B2

United States Patent
Zhang et al.

(10) Patent No.: US 10,886,343 B2
(45) Date of Patent: Jan. 5, 2021

(54) PIXEL DEFINING LAYER AND METHOD FOR MANUFACTURING THE SAME, DISPLAY PANEL AND METHOD FOR MANUFACTURING THE SAME, AND DISPLAY DEVICE

(71) Applicant: BOE Technology Group Co., Ltd., Beijing (CN)

(72) Inventors: Yuxin Zhang, Beijing (CN); Hongfei Cheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 98 days.

(21) Appl. No.: 16/329,401

(22) PCT Filed: Apr. 23, 2018

(86) PCT No.: PCT/CN2018/084051
§ 371 (c)(1),
(2) Date: Feb. 28, 2019

(87) PCT Pub. No.: WO2019/041836
PCT Pub. Date: Mar. 7, 2019

(65) Prior Publication Data
US 2020/0161391 A1 May 21, 2020

(30) Foreign Application Priority Data
Aug. 30, 2017 (CN) .......................... 2017 1 0761649

(51) Int. Cl.
*H01L 27/32* (2006.01)
*H01L 51/56* (2006.01)
(Continued)

(52) U.S. Cl.
CPC ...... *H01L 27/3246* (2013.01); *H01L 51/0005* (2013.01); *H01L 51/56* (2013.01); *H01L 2227/323* (2013.01)

(58) Field of Classification Search
CPC . H01L 27/3246; H01L 51/0005; H01L 51/56; H01L 2227/323; H01L 2251/558; H01L 27/156; H01L 33/005
See application file for complete search history.

(56) References Cited

U.S. PATENT DOCUMENTS 7,012,367 B2 * 3/2006 Seki .................... H01L 27/3246
257/72
7,294,856 B2 * 11/2007 Ito ...................... H01L 27/3246
257/13
(Continued)

FOREIGN PATENT DOCUMENTS

CN 104409647 A 3/2015
CN 105118845 A 12/2015
(Continued)

OTHER PUBLICATIONS

English Translation International Search Report (dated 2018).*
(Continued)

*Primary Examiner* — Mary A Wilczewski
(74) *Attorney, Agent, or Firm* — Westman, Champlin & Koehler, P.A.

(57) ABSTRACT

A pixel defining layer and a method for manufacturing the same, a display panel and a method for manufacturing the same, and a display device are provided. The pixel defining layer includes a plurality of pixel defining patterns. Each of the pixel defining patterns includes a first sub-defining pattern and a second sub-defining pattern, the second sub-defining pattern being embedded within the first sub-defining pattern, and an outer edge of the second sub-defining pattern is connected to an inner edge of the first sub-defining
(Continued)

pattern, wherein a thickness of the first sub-defining pattern is greater than a thickness of the second sub-defining pattern, and a region surrounded by the second sub-defining pattern is a light emitting region of a light emitting layer.

16 Claims, 6 Drawing Sheets

(51) Int. Cl.
    *H01L 51/52*     (2006.01)
    *H01L 51/00*     (2006.01)

(56) References Cited

U.S. PATENT DOCUMENTS

| | | | |
|---|---|---|---|
| 9,418,893 B2* | 8/2016 | Park | H01L 21/308 |
| 9,911,795 B2 | 3/2018 | Hou et al. | |
| 10,692,949 B2* | 6/2020 | Lee | G09G 3/3233 |
| 10,693,068 B2* | 6/2020 | Lee | H01L 51/0011 |
| 10,720,601 B2* | 7/2020 | Chen | H01L 33/405 |
| 10,748,977 B2* | 8/2020 | Sim | H01L 27/3258 |
| 10,784,322 B2* | 9/2020 | Dai | H01L 51/0012 |
| 2001/0011868 A1* | 8/2001 | Fukunaga | H01L 51/5234 313/506 |
| 2003/0175414 A1* | 9/2003 | Hayashi | H01L 51/0005 427/66 |
| 2004/0232814 A1* | 11/2004 | Sakai | H01L 51/0005 313/310 |
| 2006/0223221 A1* | 10/2006 | Ishii | H01L 51/0007 438/99 |
| 2007/0075618 A1* | 4/2007 | Mitsuya | H01L 51/0004 313/292 |
| 2007/0138943 A1* | 6/2007 | Tano | H01L 51/56 313/503 |
| 2007/0148333 A1* | 6/2007 | Morimoto | H01L 51/56 427/66 |
| 2008/0303419 A1* | 12/2008 | Fukuda | H01L 27/3246 313/504 |
| 2008/0315756 A1* | 12/2008 | Jeon | H01L 27/3246 313/504 |
| 2009/0321725 A1* | 12/2009 | Yoshida | H01L 27/283 257/40 |
| 2010/0045173 A1* | 2/2010 | Kwon | H01L 27/3244 313/504 |
| 2010/0102715 A1 | 4/2010 | Suh | |
| 2010/0181559 A1* | 7/2010 | Nakatani | H01L 27/3283 257/40 |
| 2011/0108859 A1* | 5/2011 | Oosako | H01L 27/3246 257/88 |
| 2011/0198596 A1* | 8/2011 | Park | H01L 27/3246 257/59 |
| 2011/0291086 A1* | 12/2011 | Nishiyama | H01L 27/3246 257/40 |
| 2013/0038203 A1* | 2/2013 | Kim | H01L 51/5265 313/504 |
| 2014/0027729 A1* | 1/2014 | So | H01L 51/525 257/40 |
| 2014/0197385 A1* | 7/2014 | Madigan | H01L 51/0005 257/40 |
| 2015/0102316 A1* | 4/2015 | Park | H01L 27/3262 257/40 |
| 2015/0357388 A1* | 12/2015 | Pang | H01L 51/5044 257/40 |
| 2016/0111688 A1* | 4/2016 | Lee | H01L 27/3246 257/40 |
| 2016/0118631 A1* | 4/2016 | Kim | H01L 51/56 438/34 |
| 2016/0293683 A1* | 10/2016 | Hou | H01L 51/001 |
| 2017/0005150 A1* | 1/2017 | Yeo | H01L 27/3262 |
| 2017/0062545 A1* | 3/2017 | Oh | H01L 27/3246 |
| 2017/0077196 A1* | 3/2017 | Kanda | H01L 51/5253 |
| 2017/0117506 A1* | 4/2017 | Hiraoka | H01L 27/3244 |
| 2017/0133443 A1* | 5/2017 | Nendai | H01L 51/56 |
| 2017/0141169 A1* | 5/2017 | Sim | H01L 27/3258 |
| 2017/0194394 A1 | 7/2017 | Hou et al. | |
| 2017/0279079 A1* | 9/2017 | Kim | H01L 51/5253 |
| 2018/0033842 A1* | 2/2018 | Bae | H01L 27/156 |
| 2018/0108685 A1* | 4/2018 | Kim | H01L 27/1248 |
| 2018/0138255 A1* | 5/2018 | Lee | G09G 3/3233 |
| 2018/0184501 A1* | 6/2018 | Park | H05B 33/26 |
| 2018/0254434 A1* | 9/2018 | Chen | H01L 27/3258 |
| 2018/0374909 A1* | 12/2018 | Nishikiori | H01L 27/3246 |
| 2019/0058019 A1* | 2/2019 | Hu | H01L 51/56 |
| 2019/0181196 A1* | 6/2019 | Dai | H01L 27/3283 |
| 2019/0206963 A1* | 7/2019 | Zhang | H01L 51/5253 |
| 2020/0043998 A1* | 2/2020 | Choi | H01L 27/3246 |
| 2020/0058729 A1* | 2/2020 | Jung | H01L 27/3246 |
| 2020/0161391 A1* | 5/2020 | Zhang | H01L 27/3246 |
| 2020/0194518 A1* | 6/2020 | Myung | H01L 27/3246 |
| 2020/0194520 A1* | 6/2020 | Seo | H01L 27/3216 |
| 2020/0203448 A1* | 6/2020 | Kim | H01L 51/56 |

FOREIGN PATENT DOCUMENTS

| | | | | |
|---|---|---|---|---|
| CN | 107046048 A | | 8/2017 | |
| CN | 107393939 A | | 11/2017 | |
| CN | 207116433 U | | 3/2018 | |
| JP | 2005-222776 A | | 8/2005 | |
| WO | WO 2019041836 | * | 3/2019 | H01L 27/32 |

OTHER PUBLICATIONS

English Translation of the Written Opinion (dated 2018).*
International Search Report and Written Opinion (including English translation of Search Report and Box V of Written Opinion) for International Application No. PCT/CN2018/084051, dated Jul. 27, 2018, 14 pages.
First Office Action, including Search Report, for Chinese Patent Application No. 201710761649.9, dated Mar. 29, 2019, 20 pages.

* cited by examiner

PIXEL DEFINING LAYER AND METHOD FOR MANUFACTURING THE SAME, DISPLAY PANEL AND METHOD FOR MANUFACTURING THE SAME, AND DISPLAY DEVICE

CROSS-REFERENCE TO RELATED APPLICATION

This application is a Section 371 National Stage Application of International Application No. PCT/CN2018/084051, filed on Apr. 23, 2018, entitled "PIXEL DEFINING LAYER AND METHOD FOR MANUFACTURING THE SAME, DISPLAY PANEL AND METHOD FOR MANUFACTURING THE SAME, AND DISPLAY DEVICE", which claims priority to Chinese Patent Application No. 201710761649.9 filed on Aug. 30, 2017 with CNIPA, incorporated herein by reference in entirety.

TECHNICAL FIELD

Embodiments of the present disclosure relate to the field of display technology, and in particular, to a pixel defining layer and a method for manufacturing the same, a display panel and a method for manufacturing the same, and a display device.

BACKGROUND

The self-luminous display panel generally includes an anode, a light emitting layer, a cathode, and the like. For example, the self-luminous display panels may include a quantum dot light emitting diode (QLED) display panel and an organic light emitting diode (OLED) display panel, etc. The light emitting layer generally includes a hole injection layer, a hole transport layer, a light emitting material layer, an electron transport layer, an electron injection layer, etc. The light emitting layer can be generally prepared by a solution method, for example, the light emitting layer may be manufactured by Ink-Jet Printing (IJP) technology.

In the process of preparing the light emitting layer, it is generally required to form a pixel defining layer on a base substrate, and then spray ink in which the material of the light emitting layer is dissolved to a region surrounded by the pixel defining layer, and then the light emitting layer is formed after the ink solvent evaporates.

SUMMARY

In a first aspect, there is provided a pixel defining layer comprising a plurality of pixel defining patterns, wherein each of the pixel defining patterns comprises a first sub-defining pattern and a second sub-defining pattern, the second sub-defining pattern being embedded within the first sub-defining pattern, and an outer edge of the second sub-defining pattern is connected to an inner edge of the first sub-defining pattern, wherein a thickness of the first sub-defining pattern is greater than a thickness of the second sub-defining pattern, and a region surrounded by the second sub-defining pattern is a light emitting region of a light emitting layer.

Optionally, the second sub-defining pattern is an annular pattern.

Optionally, the first sub-defining pattern is integrally formed with the second sub-defining pattern.

Optionally, each of the pixel defining patterns further comprises a protrusion structure disposed on the second sub-defining pattern, and a sum of a thickness of the protrusion structure and the thickness of the second sub-defining pattern is less than the thickness of the first sub-defining pattern.

Optionally, the protrusion structure of each of the pixel defining patterns is a closed ring of an integral structure, or the protrusion structure of each of the pixel defining patterns comprises a plurality of structures arranged in an extending direction of the second sub-defining pattern.

Optionally, the protrusion structure is integrally formed with the second sub-defining pattern, or the protrusion structure, the first sub-defining pattern and the second sub-defining pattern are integrally formed with each other.

Optionally, the plurality of pixel defining patterns are insulated from each other.

In a second aspect, there is provided a method for manufacturing a pixel defining layer, comprising:

forming a plurality of pixel defining patterns, wherein each of the pixel defining patterns comprises a first sub-defining pattern and a second sub-defining pattern, the second sub-defining pattern being embedded within the first sub-defining pattern, and an outer edge of the second sub-defining pattern is connected to an inner edge of the first sub-defining pattern, and wherein a thickness of the first sub-defining pattern is greater than a thickness of the second sub-defining pattern, and a region surrounded by the second sub-defining pattern is a light emitting region of a light emitting layer.

Optionally, the pixel defining patterns are made of a photosensitive resin material, and the forming the plurality of pixel defining patterns comprises:

forming a pixel defining film layer;

exposing the pixel defining film layer with a halftone mask;

developing the exposed pixel defining film layer; and baking the developed pixel defining film layer to obtain the pixel defining patterns.

Optionally, the halftone mask comprises a first light transmissive region, a second light transmissive region, and a light shielding region, the second light transmissive region being an annular region, the first light transmissive region being a region surrounded by the second light transmissive region, and the light shielding region being a region surrounding the second light transmissive region, wherein a light transmittance of the first light transmissive region is greater than a light transmittance of the second light transmissive region, and the exposing the pixel defining film layer with the halftone mask comprises:

exposing the pixel defining film layer by using the first light transmissive region and the second light transmissive region of the halftone mask, so that a first exposure region and a second exposure region are formed in the exposed pixel defining film layer, the first exposure region corresponding to the first light transmissive region, and the second exposure region corresponding to the second light transmissive region, wherein a thickness of the first exposure region after being developed is 0, and a thickness of the second exposure region after being developed is x, where x>0.

Optionally, the halftone mask comprises a first light transmissive region, a second light transmissive region, a third light transmissive region, and a light shielding region, the second light transmissive region and the third light transmissive region constituting an annular region, the first light transmissive region being a region surrounded by the annular region, the second light transmissive region surrounding the third light transmissive region, and the light shielding region being a region surrounding the annular region, wherein a light transmittance of the first light transmissive region is greater than a light transmittance of the second light transmissive region, the light transmittance of the second light transmissive region is greater than a light transmittance of the third light transmissive region, and the exposing the pixel defining film layer with the halftone mask comprises:

exposing the pixel defining film layer by using the first light transmissive region, the second light transmissive region and the third light transmissive region of the halftone mask, so that a first exposure region, a second exposure region and a third exposure region are formed in the exposed pixel defining film layer, the first exposure region corresponding to the first light transmissive region, the second exposure region corresponding to the second light transmissive region, and the third exposure region corresponding to the third light transmissive region, wherein a thickness of the first exposure region after being developed is 0, a thickness of the second exposure region after being developed is x, and a thickness of the third exposure region after being developed is y, where y>x>0.

In a third aspect, there is provided a display panel comprising a base substrate and the pixel defining layer according to the first aspect, disposed on the base substrate.

Optionally, the display panel further comprises: a first electrode disposed between the base substrate and the pixel defining layer, and a light emitting layer and a second electrode stacked at a side of the first electrode away from the base substrate, wherein a thickness of the light emitting layer is less than a thickness of the first sub-defining pattern, and the thickness of the light emitting layer is greater than a thickness of the second sub-defining pattern.

Optionally, the light emitting layer is an organic light emitting layer or an inorganic light emitting layer.

In a fourth aspect, there is provided a method for manufacturing a display panel, comprising:

providing a base substrate;

forming a first electrode on the base substrate;

forming a pixel defining layer on the base substrate on which the first electrode is formed, wherein the pixel defining layer comprises a plurality of pixel defining patterns, each of the pixel defining patterns comprises a first sub defining pattern and a second sub-defining pattern, the second sub-defining pattern being embedded within the first sub-defining pattern, an outer edge of the second sub-defining pattern is connected to an inner edge of the first sub-defining pattern, and a thickness of the first sub-defining pattern is greater than a thickness of the second sub-defining pattern;

spraying ink in which a light emitting material is dissolved on the base substrate on which the pixel defining layer is formed, so that a level of the ink is higher than the second sub-defining pattern and lower than the first sub-defining pattern to form a light emitting layer, wherein a light emitting region of the light emitting layer is a region surrounded by the second sub-defining pattern; and forming a second electrode on the base substrate on which the light emitting layer is formed.

In a fifth aspect, there is provided a display device comprising the display panel according to the third aspect.

Optionally, the display device further comprises a thin film transistor of a top gate structure or a bottom gate structure.

Optionally, the display device is of a top emission type, a bottom emission type, or an inversion type.

Optionally, an inner edge of the protrusion structure is flush with an inner edge of the second sub-defining pattern.

BRIEF DESCRIPTION OF THE DRAWINGS

FIG. 2-1 is a schematic structural view of a pixel defining layer according to an embodiment of the present disclosure;

FIG. 2-2 is a cross-sectional view of a pixel defining pattern in the pixel defining layer illustrated in FIG. 2-1;

FIG. 2-3 is a cross-sectional view of a pixel defining pattern according to another embodiment of the present disclosure;

FIG. 2-4 is a top view of the pixel defining pattern illustrated in FIG. 2-3;

FIG. 2-5 is another top view of the pixel defining pattern illustrated in FIG. 2-3;

FIG. 3 is a schematic structural view of a display panel according to an embodiment of the present disclosure;

FIG. 4 is a schematic structural view of a display device according to an embodiment of the present disclosure;

FIG. 5-1 is a flow chart of a method for forming a pixel defining pattern according to an embodiment of the present disclosure;

FIG. 5-2 illustrates a structure in which a pixel defining film layer is formed on a base substrate;

FIG. 5-3 is a schematic view showing an exposure of a pixel defining film layer by using a halftone mask according to an embodiment of the present disclosure;

FIG. 5-4 is a schematic view showing an exposure of a pixel defining film layer by using a halftone mask according to another embodiment of the present disclosure.

DETAILED DESCRIPTION OF EMBODIMENTS

In order to understand the objectives, technical solutions, and advantages of the present disclosure clearly, the embodiments of the present disclosure will be further described in detail below with reference to the accompanying drawings.

The self-luminous display (such as a QLED display and an OLED display) has advantages of self-luminescence, quick response, wide viewing angle, high brightness, bright color, thinness and lightness compared with the liquid crystal display. The method for manufacturing a film layer in an electroluminescent device mainly includes a vacuum evaporation process and a solution process. The vacuum evaporation process is suitable for film formation of organic small molecular materials, and has advantages of good film formation uniformity and being relative mature technology. The solution process includes spin coating, inkjet printing, and nozzle coating methods. The inkjet printing technology is considered to be a method for mass production of large-size QLEDs and OLEDs due to its high material utilization rate and possibility of large dimension. The inkjet printing technique requires that a pixel defining layer may be formed in advance on a base substrate on which a first electrode is formed, to define inkjet printing solution to accurately flow into designated R/G/B sub-pixel regions. In the process of preparing a light emitting layer, it is generally required to form a pixel defining layer on a base substrate, and then spray ink in which the material of the light emitting layer is dissolved into a region surrounded by the pixel defining layer, and then form the light emitting layer after the ink solvent evaporates.

However, since the ink may climb on the pixel defining layer, a thickness of an edge region (near the pixel defining layer) in a light emitting region defined by the pixel defining layer is greater than a thickness of the central region. After the ink solvent evaporates to form the light emitting layer, it appears a phenomenon of coffee ring, which causes the thickness of the light emitting region of the light emitting layer to be non-uniform, and thereby results in poor uniformity of display brightness of the display panel.

Figure 1:
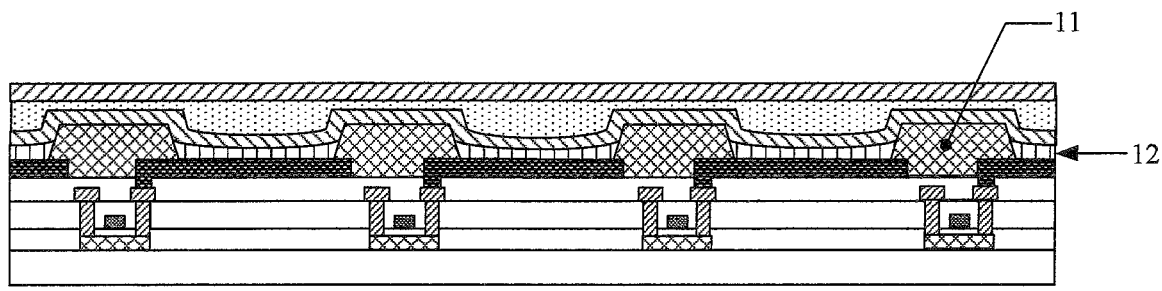
FIG. 1 is a schematic structural view of a self-luminous display device in the related art.

Specifically, a schematic structural view of the self-luminous display device is shown in FIG. 1. The cross section of the pixel defining layer 11 is an "uprightly-placed" trapezoid. Since there is a surface energy difference between the inkjet printing solution and the pixel defining layer 11 at the contact position thereof and the side surface of the pixel defining layer 11 has a certain inclination angle, the solution has a certain degree of climbing on the pixel defining layer 11, which causes the light emitting layer 12 formed after the solvent is dried to have a phenomenon of thick edge and thin central portion, i.e., coffee ring effect, causes the thickness of the light emitting layer to be non-uniform, and thereby results in poor uniformity of display brightness of the display panel.

Embodiments of the present disclosure provide a pixel defining layer and a method for manufacturing the same, a display panel and a method for manufacturing the same, and a display device, which can solve the problem in the related art that the thickness of the light emitting region of the light emitting layer is non-uniform, and thereby the uniformity of display brightness of the display panel is poor.

Figures 1, 2:
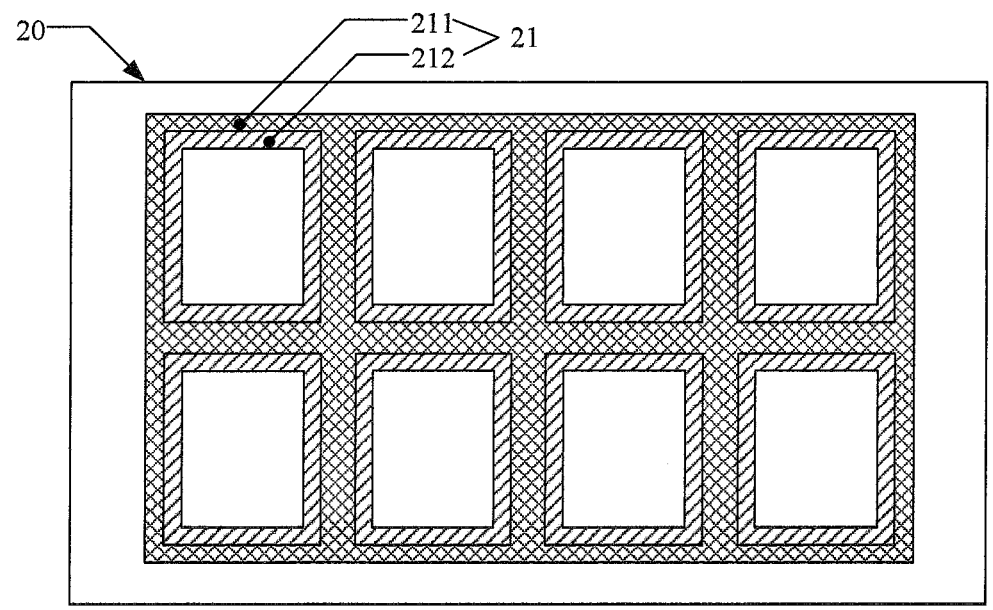
Figure 2:
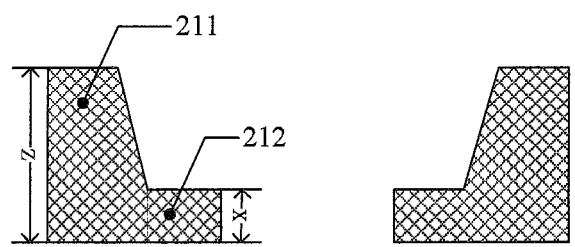

As shown in FIG. 2-1, the pixel defining layer 20 includes: a plurality of insulated pixel defining patterns 21 arranged in a matrix on a base substrate. Each pixel defining pattern 21 includes a first sub-defining pattern 211 and a second sub-defining pattern 212, the second sub-defining pattern 212 being embedded within the first sub-defining pattern 211, and an outer edge of the second sub-defining pattern 212 is connected to an inner edge of the first sub-defining pattern 211.

Optionally, the pixel defining pattern may be of an annular structure, that is, the first sub-defining pattern and the second sub-defining pattern are both of a ring/annular structure. For example, as shown in FIG. 2-1, the pixel defining pattern 21 may be of a ring structure in a square shape. In practical applications, the pixel defining pattern may also be of a ring structure in a circular or elliptical shape, and the embodiments of the present disclosure are not limited thereto.

FIG. 2-2 is a cross-sectional view of a pixel defining pattern in the pixel defining layer illustrated in FIG. 2-1. As shown in FIG. 2-2, the thickness z of the first sub-defining pattern 211 is greater than the thickness x of the second sub-defining pattern 212. Herein, the thickness refers to a dimension in a direction perpendicular to the base substrate.

It should be noted that, when the light emitting layer is formed on the base substrate formed with the pixel defining layer as shown in FIG. 2-1, the thickness of the light emitting layer is greater than the thickness x of the second sub-defining pattern, and the thickness of the light emitting layer is less than the thickness z of the first sub-defining pattern, that is, the light emitting layer is higher than the highest point of the second sub-defining pattern and lower than the highest point of the first sub-defining pattern. The region surrounded by the second sub-defining pattern is the light emitting region of the light emitting layer.

In summary, the pixel defining layer according to the embodiment of the present disclosure includes a plurality of pixel defining patterns, each pixel defining pattern includes a first sub-defining pattern and a second sub-defining pattern, and the second sub-defining pattern has a thickness less than the thickness of the first sub-defining pattern. When performing inkjet printing, the ink may be configured to cover the highest point of the second sub-defining pattern and to be lower than the highest point of the first sub-defining pattern, so that the climbing or speeling phenomenon occurs at a side wall of the first sub-defining pattern, while the liquid level of the central region surrounded by the second sub-pixel defining pattern is kept relatively flush. Since the light emitting region of the finally formed light emitting layer is the central region surrounded by the second sub-defining pattern and the thickness uniformity of the central region is relatively high, the thickness uniformity of the light emitting region of the light emitting layer is relatively high, thereby the uniformity of the display brightness of the display panel can be ensured.

Optionally, as shown in FIG. 2-1, the second sub-defining pattern 212 is an annular base, and the annular base is embedded within the first sub-defining pattern 211, and the outer edge of the annular base is connected to the inner edge of the first sub-defining pattern 211.

In the embodiment of the present disclosure, a sum of a width of the first sub-defining pattern and a width of the second sub-defining pattern may be the same as a width of the pixel defining layer in the related art (for example, the width of the pixel defining layer in the related art may be 40-60 micrometers). That is, the area of the light emitting region of the light emitting layer surrounded by the second sub-defining pattern is the same as the area of the region where the light emitting layer is located in the related art, thus it can solve the problem that the uniformity of display brightness of the display panel in the related art is poor, in case where other film layers of the display panel (for example, the first electrode and the second electrode or the like) would not be changed.

Figures 2, 3:
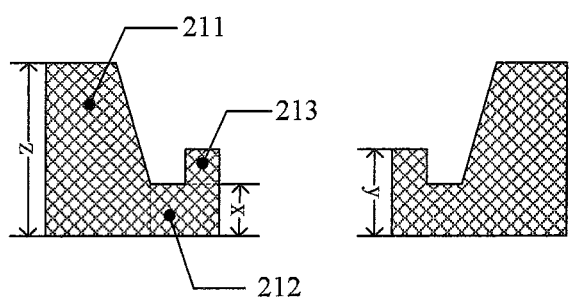

Further, as shown in FIG. 2-3, the pixel defining pattern 21 may further include a protrusion structure 213 disposed on the second sub-defining pattern 212, a sum y of the thickness of the protrusion structure 213 and the thickness x of the second sub-defining pattern is less than the thickness z of the first sub-defining pattern.

Figures 2, 3, 4:
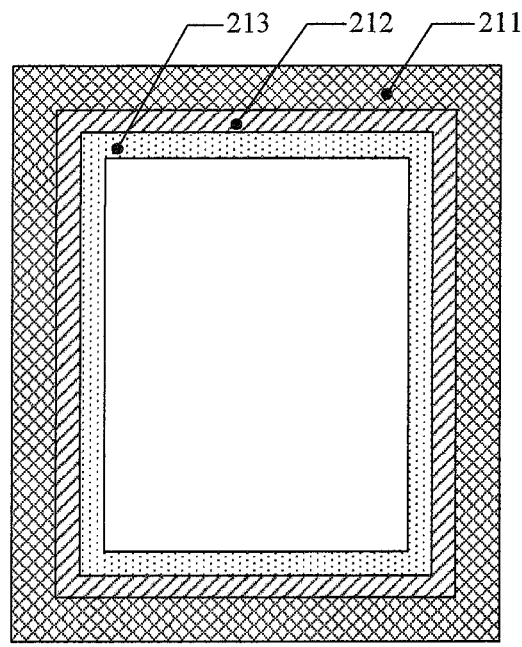

Optionally, FIG. 2-4 and FIG. 2-5 are top views of the pixel defining pattern shown in FIG. 2-3, respectively. As shown in FIG. 2-4, the protrusion structure 213 may be of an integral structure, for example, the protrusion structure may be of a closed annular structure that is concentric with the second sub-defining pattern 212. Alternatively, as shown in FIG. 2-5, the protrusion structure 213 may include a plurality of strip-shaped structures arranged in an extending direction of the second sub-defining pattern 212. The strip-shaped structures a may constitute a non-closed annular structure. Herein, the extending direction refers to a direction of the second sub-defining pattern which is in parallel with the base substrate.

The protrusion structure may be used to identify the depth of the ink sprayed during the inkjet printing in the process of forming the light emitting layer, for example, the sum of the thickness of the protrusion structure and the thickness of the second sub-defining pattern may be set to be equal to the thickness of the light emitting layer. In this case, when the level of the ink is higher than the protrusion structure, the spray of the ink may be stopped.

Alternatively, the pixel defining pattern may be made of a photosensitive resin material.

In summary, the pixel defining layer according to the embodiment of the present disclosure includes a plurality of pixel defining patterns, each pixel defining pattern includes a first sub-defining pattern and a second sub-defining pattern, and the second sub-defining pattern has a thickness less than the thickness of the first sub-defining pattern. When performing inkjet printing, the ink may be configured to cover the second sub-defining pattern and to be lower than the first sub-defining pattern, so that the light emitting region of the finally formed light emitting layer is the central region surrounded by the second sub-defining pattern. Since the thickness uniformity of the central region is relatively high, the thickness uniformity of the light emitting region of the light emitting layer is relatively high, thereby the uniformity of the display brightness of the display panel can be ensured.

An embodiment of the present disclosure provides a display panel, including a base substrate and a pixel defining layer disposed on the substrate, and the pixel defining layer may be a pixel defining layer as shown in any one of FIG. 2-1 to FIG. 2-5.

For example, as shown in FIG. 3, the display panel includes a base substrate 30 and a pixel defining layer as shown in FIG. 2-2, disposed on the base substrate 30.

Further, the display panel may further include: a first electrode 40 disposed between the base substrate 30 and the pixel defining layer 20, and a light emitting layer 50 and a second electrode 60 stacked at a side of the first electrode 40 away from the base substrate 30. As shown in FIG. 3, the thickness of the light emitting layer 50 is less than the thickness of the first sub-defining pattern 211, and the thickness of the light emitting layer 50 is greater than the thickness of the second sub-defining pattern 212. The light emitting region of the light emitting layer 50 is a region surrounded by the second sub-defining pattern 212.

It should be noted that the first electrode has different polarity from that of the second electrode. If the first electrode is an anode, the second electrode is a cathode. Alternatively, if the first electrode is a cathode, the second electrode is an anode.

Optionally, the first electrode may include a plurality of sub-electrodes arranged in an array and spaced away from each other, and the second electrode may be of an integral structure; or, the first electrode may be of an integral structure, and the second electrode includes a plurality of sub-electrodes arranged in an array and spaced away from each other; or, the first electrode and the second electrode each include a plurality of sub-electrodes arranged in an array and spaced away from each other. The embodiments of the present disclosure are not limited thereto.

Optionally, the light emitting layer may be an organic light emitting layer or an inorganic light emitting layer. The light emitting layer (that is, an electroluminescence (EL) layer) may include a hole injection layer, a hole transport layer, a light emitting material layer, an electron transport layer, and an electron injection layer. If the light emitting layer is an organic light emitting layer, the light emitting material layer is an organic light emitting material layer; if the light emitting layer is an inorganic light emitting layer, the light emitting material layer is an inorganic light emitting material layer. For example, the inorganic light emitting material layer may be a film layer doped with a quantum dot (QD) material. On the one hand, the QD material may emit light in a scattering mode under the excitation of incident light, which allows the display brightness of the display panel to be more uniform; on the other hand, the QD material can emit different colors of fluorescence, and there is no need to attach color filters, thereby simplifying the manufacturing process.

For example, the display panel according to the embodiment of the present disclosure may be an OLED display panel or a QLED display panel.

In summary, the display panel according to the embodiment of the present disclosure includes a pixel defining layer consisting of a plurality of pixel defining patterns, each pixel defining pattern includes a first sub-defining pattern and a second sub-defining pattern, and the second sub-defining pattern has a thickness less than the thickness of the first sub-defining pattern. When performing inkjet printing, the ink may be configured to cover the highest point of the second sub-defining pattern and to be lower than the highest point of the first sub-defining pattern, so that the climbing or speeling phenomenon occurs at a side wall of the first sub-defining pattern, while the liquid level of the central region surrounded by the second sub-pixel defining pattern is kept relatively flush. Since the light emitting region of the finally formed light emitting layer is the central region surrounded by the second sub-defining pattern and the thickness uniformity of the central region is relatively high, the thickness uniformity of the light emitting region of the light emitting layer is relatively high, thereby the uniformity of the display brightness of the display panel can be ensured.

An embodiment of the present disclosure provides a display device including the display panel as shown in FIG. 3.

Further, as shown in FIG. 4, the display device may further include a thin film transistor (TFT) 70, which is of a top gate structure. In the embodiment of the present disclosure, the TFT may also be of a bottom gate structure. The embodiments of the present disclosure are not limited thereto. Herein, the TFT is used to apply a voltage to the first electrode.

Optionally, the display device according to the embodiment of the present disclosure may be of a top emission type, a bottom emission type, or an inversion type. The display device may be any product or component having a display function, such as a liquid crystal panel, an electronic paper, a mobile phone, a tablet computer, a television, a display, a notebook computer, a digital photo frame, a navigator, and the like. For example, the display device can be an OLED display device or a QLED display device.

In summary, the display device according to the embodiment of the present disclosure includes a pixel defining layer consisting of a plurality of pixel defining patterns, each pixel defining pattern includes a first sub-defining pattern and a second sub-defining pattern, and the second sub-defining pattern has a thickness less than the thickness of the first sub-defining pattern. When performing inkjet printing, the ink may be configured to cover the highest point of the second sub-defining pattern and to be lower than the highest point of the first sub-defining pattern, so that the climbing or speeling phenomenon occurs at a side wall of the first sub-defining pattern, while the liquid level of the central region surrounded by the second sub-pixel defining pattern is kept relatively flush. Since the light emitting region of the finally formed light emitting layer is the central region surrounded by the second sub-defining pattern and the thickness uniformity of the central region is relatively high, the thickness uniformity of the light emitting region of the light emitting layer is relatively high, thereby the uniformity of the display brightness of the display panel can be ensured.

An embodiment of the present disclosure provides a method for manufacturing a pixel defining layer, including:

providing a base substrate; forming a plurality of insulated pixel defining patterns arranged in a matrix on the base substrate, wherein each of the pixel defining patterns comprises a first sub-defining pattern and a second sub-defining pattern, the second sub-defining pattern being embedded within the first sub-defining pattern, and an outer edge of the second sub-defining pattern is connected to an inner edge of the first sub-defining pattern, wherein a thickness of the first sub-defining pattern is greater than a thickness of the second sub-defining pattern, and a region surrounded by the second sub-defining pattern is a light emitting region of the light emitting layer.

Optionally, the pixel defining pattern may be made of a photosensitive resin material, and the photosensitive resin material may, on the one hand, make the formed pixel defining pattern provide an insulation function, and on the other hand, only exposure and developing are needed in the manufacturing process of the pixel defining pattern, thereby simplifying the manufacturing process.

Figures 2, 3, 4, 5:
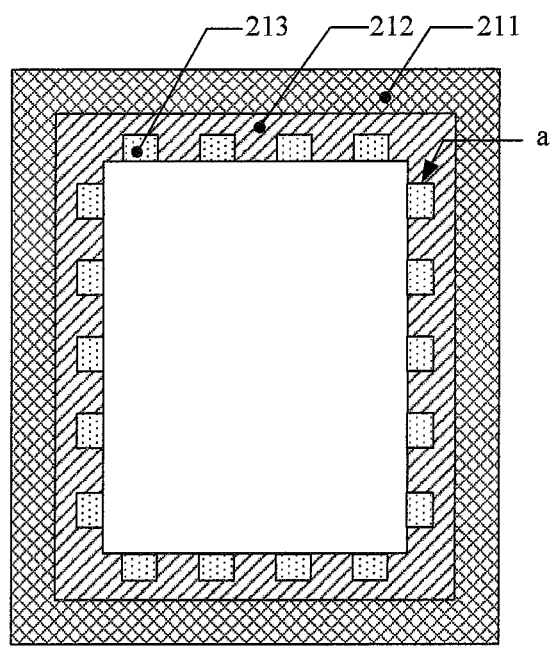
Figure 3:
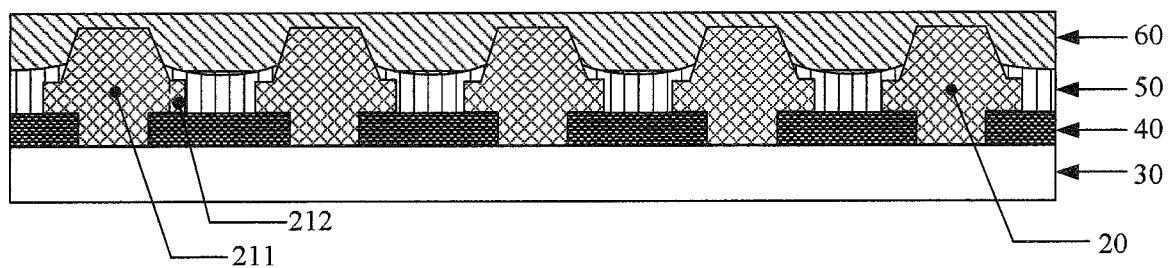
Figure 4:
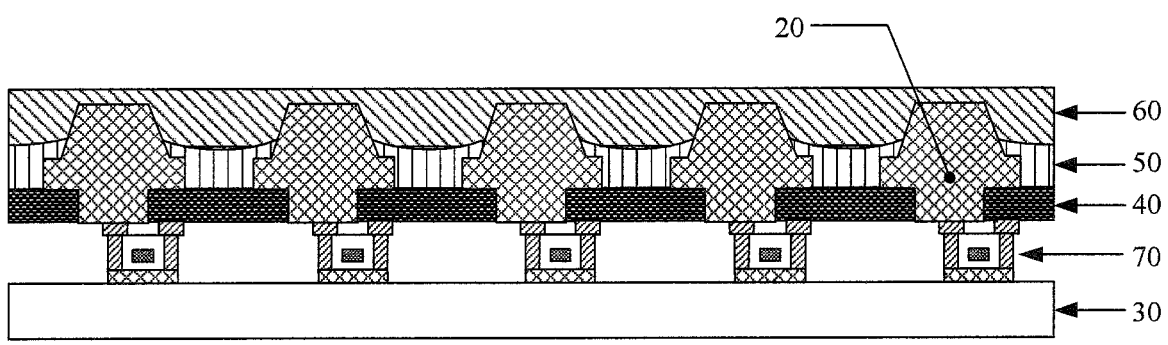
Figures 1, 5:
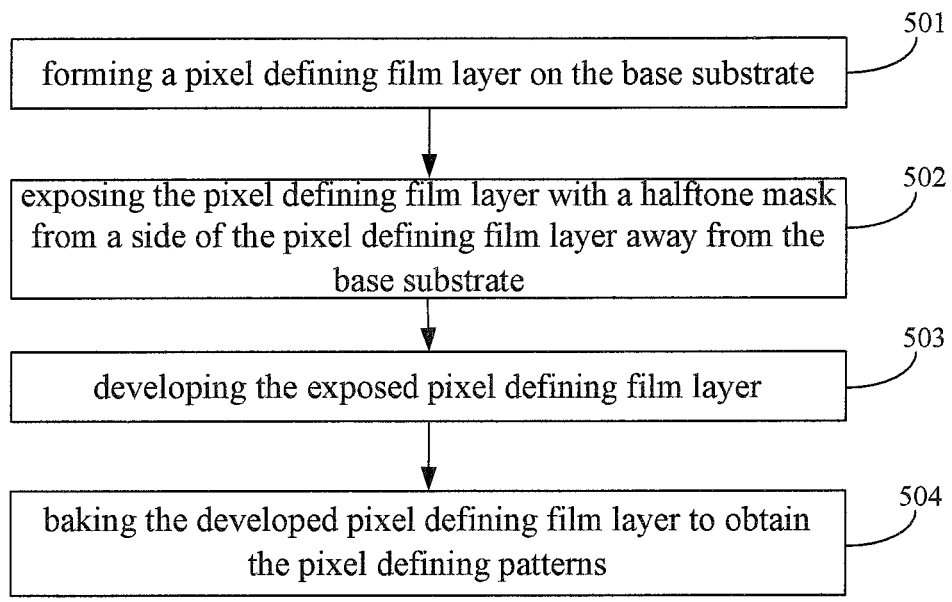
Figures 2, 5:
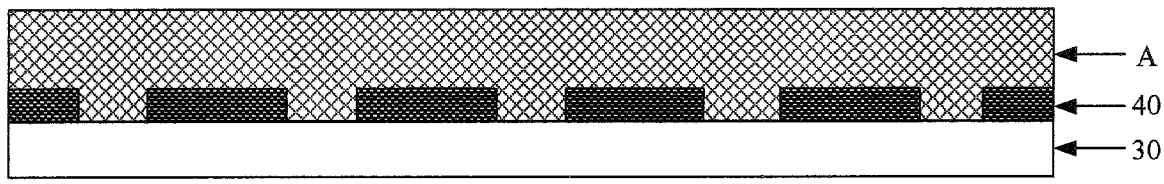
Figures 3, 5:
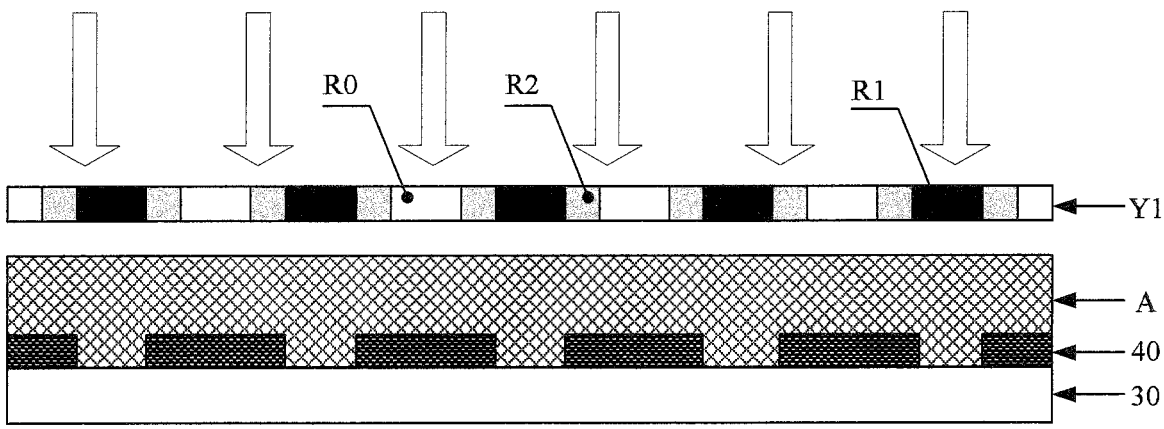
Figures 4, 5:
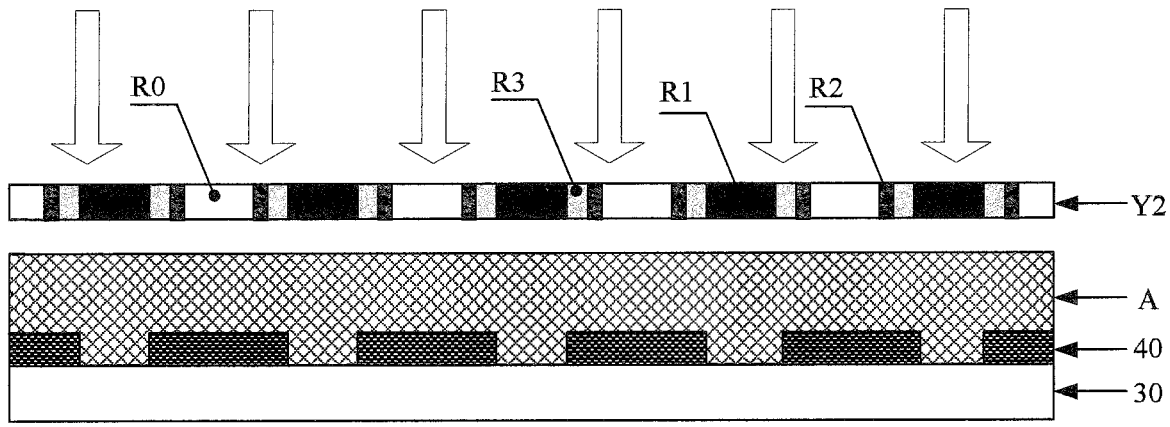

Correspondingly, as shown in FIG. 5-1, a specific process of forming the plurality of insulated pixel defining patterns in a matrix on the base substrate may include:

Step 501: forming a pixel defining film layer on the base substrate.

Optionally, a photosensitive resin material having a certain thickness may be coated on the base substrate to obtain the pixel defining film layer.

For example, referring to FIG. 5-2, it illustrates a structure in which the pixel defining film layer A is formed on the base substrate 30.

It should be noted that, referring to FIG. 5-2 to FIG. 5-4, a first electrode 40 is formed on the base substrate 30 before the pixel defining pattern is formed.

Step 502: exposing the pixel defining film layer with a halftone mask from a side of the pixel defining film layer away from the base substrate.

Optionally, the pixel defining pattern may have many kinds of structures. The embodiment of the present disclosure is illustrated by taking the pixel defining patterns as shown in FIG. 2-2 and FIG. 2-3 as an example. Correspondingly, the structure of the halftone mask used for forming the pixel defining pattern as shown in FIG. 2-2 is different from the structure of the halftone mask used for forming the pixel defining pattern as shown in FIG. 2-3.

For example, in the embodiment of the present disclosure, it is described by taking a positive photoresist as an example of the photosensitive resin material forming the pixel defining film layer.

On the one hand, FIG. 5-3 is a schematic view showing an exposure of a pixel defining film layer by using a halftone mask (corresponding to the pixel defining pattern shown in FIG. 2-2). The halftone mask Y1 may include a first light transmissive region R1, a second light transmissive region R2, and a light shielding region R0. The second light transmissive region R2 is an annular region, and the first light transmissive region R1 is a region surrounded by the second light transmissive region R2. The grayscale level of the halftone mask indicates the degree of light transmittance, and the greater grayscale level indicates the greater light transmittance, that is, the grayscale level of the halftone mask corresponds to the needed degree of exposure of a portion of the pixel defining film layer covered by its orthographic projection on the pixel defining film layer, and the greater grayscale level indicates the needed degree of exposure of the portion of the sub-defining film layer is larger. Referring to FIG. 5-3, the light transmittance of the first light transmissive region is greater than the light transmittance of the second light transmissive region, and the light shielding region is a region surrounding the second light transmissive region.

Correspondingly, the process of exposing the pixel defining film layer with the halftone mask may include:

exposing the pixel defining film layer by using the light transmissive regions of the halftone mask, so that a first exposure region and a second exposure region are formed in the exposed pixel defining film layer, the first exposure region corresponding to the first light transmissive region, and the second exposure region corresponding to the second light transmissive region. The thickness of the first exposure region (the region used for forming the light emitting region of the light emitting layer) after being developed is 0, and the thickness of the second exposure region (corresponding to the second sub-defining pattern) after being developed is x, and x>0. In addition, the light shielding region corresponds to the first sub-defining pattern.

On the other hand, FIG. 5-4 is a schematic view showing an exposure of a pixel defining film layer by using a halftone mask (corresponding to the pixel defining pattern shown in FIG. 2-3). The halftone mask Y2 includes a first light transmissive region R1, a second light transmissive region R2, a third light transmissive region R3, and a light shielding region R0. The second light transmissive region R2 and the third light transmissive region R3 form an annular region, the first light transmissive region R1 is a region surrounded by the annular region. The grayscale level of the halftone mask indicates the degree of light transmittance, and the greater grayscale level indicates the greater light transmittance, that is, the grayscale level of the halftone mask corresponds to the needed degree of exposure of a portion of the pixel defining film layer covered by its orthographic projection on the pixel defining film layer, and the greater grayscale level indicates the needed degree of exposure of the portion of the sub-defining film layer is larger. Referring to FIG. 5-4, the light transmittance of the first light transmissive region is greater than the light transmittance of the second light transmissive region, the light transmittance of the second light transmissive region is greater than the light transmittance of the third light transmissive region, and the light shielding region is a region surrounding the annular region.

Correspondingly, the process of exposing the pixel defining film layer with the halftone mask may include:

exposing the pixel defining film layer by using the light transmissive regions of the halftone mask, so that a first exposure region, a second exposure region and a third exposure region are formed in the exposed pixel defining film layer, the first exposure region corresponding to the first light transmissive region, the second exposure region corresponding to the second light transmissive region, and the third exposure region corresponding to the third light transmissive region. The thickness of the first exposure region (the region used for forming the light emitting region of the light emitting layer) after being developed is 0, the thickness of the second exposure region (corresponding to the second sub-defining pattern) after being developed is x, the thickness of the third exposure region (corresponding to the protrusion structure) after being developed is y, and y>x>0. In addition, the light shielding region corresponds to the first sub-defining pattern.

Step 503: developing the exposed pixel defining film layer.

By means of developing the pixel defining film layer including a plurality of regions having different exposure degrees, it can remove the photosensitive resin material of the first exposure region, and retain the photosensitive resin material of a part of the exposure regions (i.e., the second exposure region, or the second exposure region and third exposure region) and the photosensitive resin material of the light shielding region. After the development processing, a pixel defining pattern having a predetermined shape may be obtained. For example, after the pixel defining film layer exposed by using the halftone mask Y1 is subjected to the development processing, the pixel defining pattern shown in FIG. 2-2 may be obtained, and after the pixel defining film layer exposed by using the halftone mask Y2 is subjected to the development processing, the pixel defining pattern shown in FIG. 2-3 may be obtained.

Step 504: baking the developed pixel defining film layer to obtain the pixel defining patterns.

It should be noted that the sequence of the steps of the method for manufacturing the pixel defining layer according to the embodiments of the present disclosure may be appropriately adjusted, and some steps may also be correspondingly incorporated into or removed from the method according to the real situation. Any changes to the method that are readily thought of by those skilled in the art without departing from the spirit of the present disclosure should be covered by the scope of the present disclosure, and therefore they will not be described again.

In summary, in the method for manufacturing the pixel defining layer according to the embodiment of the present disclosure, the manufactured pixel defining layer includes a plurality of pixel defining patterns, each pixel defining pattern includes a first sub-defining pattern and a second sub-defining pattern, and the second sub-defining pattern has a thickness less than the thickness of the first sub-defining pattern. When performing inkjet printing, the ink may be configured to cover the highest point of the second sub-defining pattern and to be lower than the highest point of the first sub-defining pattern, so that the climbing or speeling phenomenon occurs at a side wall of the first sub-defining pattern, while the liquid level of the central region surrounded by the second sub-pixel defining pattern is kept relatively flush. Since the light emitting region of the finally formed light emitting layer is the central region surrounded by the second sub-defining pattern and the thickness uniformity of the central region is relatively high, the thickness uniformity of the light emitting region of the light emitting layer is relatively high, thereby the uniformity of the display brightness of the display panel can be ensured.

Figure 6:
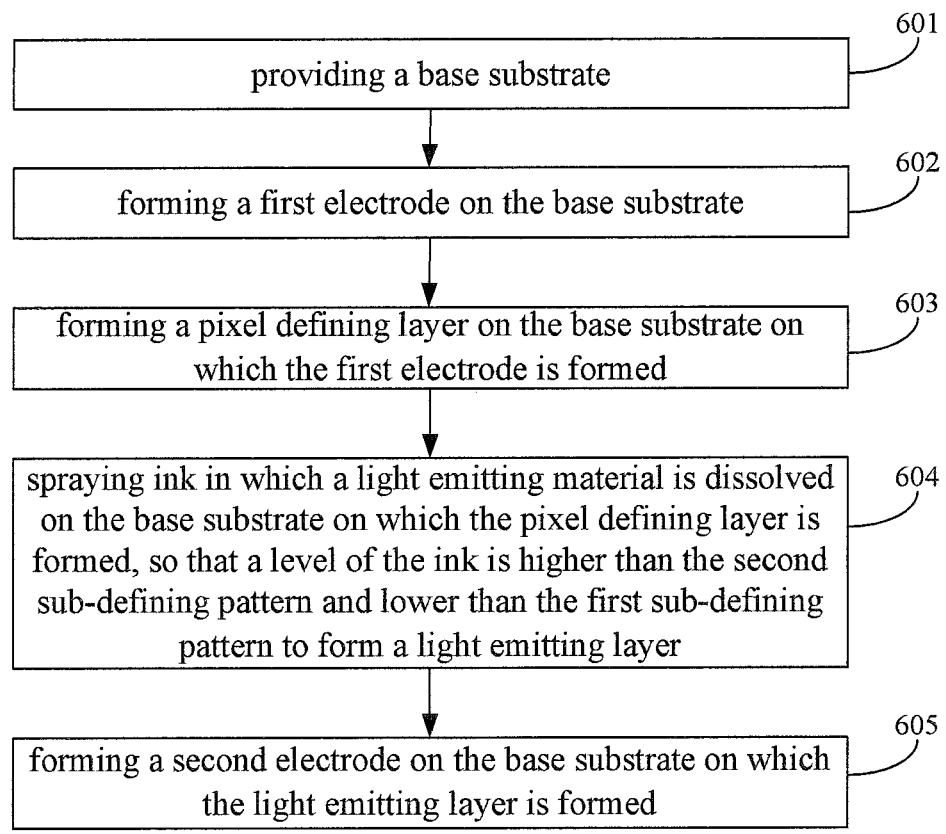
FIG. 6 is a flow chart of a method for manufacturing a display panel according to an embodiment of the present disclosure.

An embodiment of the present disclosure provides a method for manufacturing a display panel, as shown in FIG. 6, the method may include:

Step 601: providing a base substrate.

The base substrate may be a transparent substrate, and it may specifically be a substrate made of a light guiding and non-metal material having a certain hardness such as glass, quartz or transparent resin and so on.

Step 602: forming a first electrode on the base substrate.

Step 603: forming a pixel defining layer on the base substrate on which the first electrode is formed.

The pixel defining layer comprises a plurality of insulated pixel defining patterns arranged in a matrix, each of the pixel defining patterns comprises a first sub defining pattern and a second sub-defining pattern, the second sub-defining pattern being embedded within the first sub-defining pattern, an outer edge of the second sub-defining pattern is connected to an inner edge of the first sub-defining pattern, and a thickness of the first sub-defining pattern is greater than a thickness of the second sub-defining pattern.

Step 604: spraying ink in which a light emitting material is dissolved on the base substrate on which the pixel defining layer is formed, so that a level of the ink is higher than the second sub-defining pattern and lower than the first sub-defining pattern to form a light emitting layer.

A light emitting region of the light emitting layer is a region surrounded by the second sub-defining pattern.

Step 605: forming a second electrode on the base substrate on which the light emitting layer is formed.

The first electrode has different polarity from that of the second electrode. If the first electrode is an anode, the second electrode is a cathode. Alternatively, if the first electrode is a cathode, the second electrode is an anode.

Optionally, the first electrode may include a plurality of sub-electrodes arranged in an array and spaced away from each other, and the second electrode may be of an integral structure; or, the first electrode may be of an integral structure, and the second electrode includes a plurality of sub-electrodes arranged in an array and spaced away from each other; or, the first electrode and the second electrode each include a plurality of sub-electrodes arranged in an array and spaced away from each other. The embodiments of the present disclosure are not limited thereto.

Exemplarily, the structure of the display panel manufactured by the method for manufacturing the display panel is shown in FIG. 3.

In summary, in the method for manufacturing the display panel according to the embodiment of the present disclosure, the display panel includes a pixel defining layer consisting of a plurality of pixel defining patterns, each pixel defining pattern includes a first sub-defining pattern and a second sub-defining pattern, and the second sub-defining pattern has a thickness less than the thickness of the first sub-defining pattern. When performing inkjet printing, the ink may be configured to cover the highest point of the second sub-defining pattern and to be lower than the highest point of the first sub-defining pattern, so that the climbing or speeling phenomenon occurs at a side wall of the first sub-defining pattern, while the liquid level of the central region surrounded by the second sub-pixel defining pattern is kept relatively flush. Since the light emitting region of the finally formed light emitting layer is the central region surrounded by the second sub-defining pattern and the thickness uniformity of the central region is relatively high, the thickness uniformity of the light emitting region of the light emitting layer is relatively high, thereby the uniformity of the display brightness of the display panel can be ensured.

It should be clearly appreciated by those skilled in the art that, for the convenience and brevity of the description, the specific working processes of the above-described methods may refer to the specific working processes of various structures in the above-described devices of the above embodiments, and therefore the details will not be described herein again.

The above description refers to only optional embodiments of the present disclosure, but not intended to limit the present disclosure. Any modifications, equivalents, improvements made without departing from the spirit and principle of the present disclosure should fall within the scope of the present disclosure.

What is claimed is:

1. A pixel defining layer comprising a plurality of pixel defining patterns, wherein each of the pixel defining patterns comprises a first sub-defining pattern and a second sub-defining pattern, the second sub-defining pattern being embedded within the first sub-defining pattern, and an outer edge of the second sub-defining pattern is connected to an inner edge of the first sub-defining pattern, wherein a thickness of the first sub-defining pattern is greater than a thickness of the second sub-defining pattern, and a region surrounded by the second sub-defining pattern is a light emitting region of a light emitting layer;

wherein each of the pixel defining patterns further comprises a protrusion structure disposed on the second sub-defining pattern, and a sum of a thickness of the protrusion structure and the thickness of the second sub-defining pattern is less than the thickness of the first sub-defining pattern;

wherein the protrusion structure of each of the pixel defining patterns comprises a plurality of strip-shaped structures arranged in an extending direction of the second sub-defining pattern, and the plurality of strip-shaped structures constitute a non-closed annular structure; and wherein an inner edge of the protrusion structure is flush with an inner edge of the second sub-defining pattern.

2. The pixel defining layer according to claim 1, wherein the second sub-defining pattern is an annular pattern.

3. The pixel defining layer according to claim 1, wherein the first sub-defining pattern is integrally formed with the second sub-defining pattern.

4. The pixel defining layer according to claim 1, wherein the protrusion structure is integrally formed with the second sub-defining pattern, or the protrusion structure, the first sub-defining pattern and the second sub-defining pattern are integrally formed with each other.

5. The pixel defining layer according to claim 1, wherein the plurality of pixel defining patterns are insulated from each other.

6. A method for manufacturing the pixel defining layer of claim 1, comprising:

forming the plurality of pixel defining patterns, wherein each of the pixel defining patterns comprises the first sub-defining pattern and the second sub-defining pattern, the second sub-defining pattern being embedded within the first sub-defining pattern, and the outer edge of the second sub-defining pattern is connected to the inner edge of the first sub-defining pattern, and wherein the thickness of the first sub-defining pattern is greater than the thickness of the second sub-defining pattern, and the region surrounded by the second sub-defining pattern is the light emitting region of the light emitting layer.

7. The method according to claim 6, wherein the pixel defining patterns are made of a photosensitive resin material, and the forming the plurality of pixel defining patterns comprises:

forming a pixel defining film layer;

exposing the pixel defining film layer with a halftone mask;

developing the exposed pixel defining film layer; and baking the developed pixel defining film layer to obtain the pixel defining patterns.

8. The method according to claim 7, wherein the halftone mask comprises a first light transmissive region, a second light transmissive region, and a light shielding region, the second light transmissive region being an annular region, the first light transmissive region being a region surrounded by the second light transmissive region, and the light shielding region being a region surrounding the second light transmissive region, wherein a light transmittance of the first light transmissive region is greater than a light transmittance of the second light transmissive region, and the exposing the pixel defining film layer with the halftone mask comprises:

exposing the pixel defining film layer by using the first light transmissive region and the second light transmissive region of the halftone mask, so that a first exposure region and a second exposure region are formed in the exposed pixel defining film layer, the first exposure region corresponding to the first light transmissive region, and the second exposure region corresponding to the second light transmissive region, wherein a thickness of the first exposure region after being developed is 0, and a thickness of the second exposure region after being developed is x, where $x>0$.

9. The method according to claim 7, wherein the halftone mask comprises a first light transmissive region, a second light transmissive region, a third light transmissive region, and a light shielding region, the second light transmissive region and the third light transmissive region constituting an annular region, the first light transmissive region being a region surrounded by the annular region, the second light transmissive region surrounding the third light transmissive region, and the light shielding region being a region surrounding the annular region, wherein a light transmittance of the first light transmissive region is greater than a light transmittance of the second light transmissive region, the light transmittance of the second light transmissive region is greater than a light transmittance of the third light transmissive region, and the exposing the pixel defining film layer with the halftone mask comprises:

exposing the pixel defining film layer by using the first light transmissive region, the second light transmissive region and the third light transmissive region of the halftone mask, so that a first exposure region, a second exposure region and a third exposure region are formed in the exposed pixel defining film layer, the first exposure region corresponding to the first light transmissive region, the second exposure region corresponding to the second light transmissive region, and the third exposure region corresponding to the third light transmissive region, wherein a thickness of the first exposure region after being developed is 0, a thickness of the second exposure region after being developed is x, and a thickness of the third exposure region after being developed is y, where $y>x>0$.

10. A display panel comprising a base substrate and the pixel defining layer according to claim 1, disposed on the base substrate.

11. The display panel according to claim 10, further comprising: a first electrode disposed between the base substrate and the pixel defining layer, and a light emitting layer and a second electrode stacked at a side of the first electrode away from the base substrate, wherein a thickness of the light emitting layer is less than a thickness of the first sub-defining pattern, and the thickness of the light emitting layer is greater than a thickness of the second sub-defining pattern.

12. The display panel according to claim 11, wherein the light emitting layer is an organic light emitting layer or an inorganic light emitting layer.

13. A method for manufacturing a display panel, comprising:

providing a base substrate;

forming a first electrode on the base substrate;

forming the pixel defining layer of claim 1 on the base substrate on which the first electrode is formed, wherein the pixel defining layer comprises the plurality of pixel defining patterns, each of the pixel defining patterns comprises the first sub defining pattern and the second sub-defining pattern, the second sub-defining pattern being embedded within the first sub-defining pattern, the outer edge of the second sub-defining pattern is connected to the inner edge of the first sub-defining pattern, and the thickness of the first sub-defining pattern is greater than the thickness of the second sub-defining pattern;

spraying ink in which a light emitting material is dissolved on the base substrate on which the pixel defining layer is formed, so that a level of the ink is higher than the second sub-defining pattern and lower than the first sub-defining pattern to form a light emitting layer, wherein a light emitting region of the light emitting layer is a region surrounded by the second sub-defining pattern; and forming a second electrode on the base substrate on which the light emitting layer is formed.

14. A display device comprising the display panel according to claim 10.

15. The display device according to claim 14, further comprising a thin film transistor of a top gate structure or a bottom gate structure.

16. The display device according to claim 14, wherein the display device is of a top emission type, a bottom emission type, or an inversion type.

\* \* \* \* \*